United States Patent [19]

Horne

[11] Patent Number: 4,753,287
[45] Date of Patent: Jun. 28, 1988

[54] CIRCUIT BOARD INSTALLATION

[75] Inventor: David Horne, Winchester, England

[73] Assignee: BICC plc, London, England

[21] Appl. No.: 111,265

[22] Filed: Oct. 22, 1987

[30] Foreign Application Priority Data

Oct. 24, 1986 [GB] United Kingdom ............... 8625742

[51] Int. Cl.$^4$ ............................................. B22D 23/06
[52] U.S. Cl. ..................................... 165/80.3; 357/81;
165/80.4; 165/185; 361/387
[58] Field of Search ................... 165/80.2, 80.3, 80.4,
165/185; 361/386, 387; 357/81

[56] References Cited

U.S. PATENT DOCUMENTS 4,193,445  3/1980  Chu et al. .......................... 165/80.3
4,235,283  11/1980 Gupta ................................ 165/80.4
4,246,597  1/1981  Cole et al. ......................... 165/80.3

Primary Examiner—James C. Yeung
Assistant Examiner—Noah Kamen
Attorney, Agent, or Firm—Parkhurst & Oliff

[57] ABSTRACT

A thermally conductive module for locally extracting heat from an individual electrical component of a circuit board installation comprises a tubular metal housing of high thermal conductivity closed at one end and having at that end a screw-threaded stud for securing the housing to and in thermal contact with a thermal conductor. A spring-loaded metal piston of high thermal conductivity is slidably mounted in the bore of and protrudes from the housing and has a throughbore extending through and opening into the exposed end face of the piston. A grease-like medium of high thermal conductivity is contained in the closed bore of the housing. When the housing is secured in thermal contact with a thermal conductor and the exposed end face of the piston is brought into thermal contact with an electrical component from which heat is to be extracted, the piston is urged against the action of its associated coil spring and grease-like medium exudes from the throughbore and flows between the exposed end face of the piston and the electrical component to provide an effective thermal contact therebetween.

12 Claims, 2 Drawing Sheets

CIRCUIT BOARD INSTALLATION

BACKGROUND OF THE INVENTION

This invention relates to cabinets, cases and other enclosures for housing sub-racks or card frames carrying circuit boards and/or modules carrying other electrical components. A cabinet or other enclosure including such sub-racks or card frames and/or modules will hereinafter, for convenience, be referred to as a "circuit board installation of the kind described".

The developement of silicon chips has resulted in a substantial increase in the component density of individual circuit boards and/or modules of a circuit board installation of the kind described and the increased component density of each circuit board and/or module of the installation has resulted in a greater power output and hence higher operating temperatures.

Conventional methods of controlling the temperature of the enclosure of a circuit board installation of the kind described include normal convection, forced convection, e.g. fan cooling, liquid cooling, various forms of heat conductor or sink, and a combination of two or more of these methods.

Where it is recognised that a substantial proportion of the heat is emitted by a particular individual electrical component within a circuit board installation of the kind described, it has been proposed to provide for local cooling of such an individual component, e.g. by directing pressurised cooling fluid towards such an individual component, and/or for local extraction of heat from such an individual component, e.g. by means of a thermally conductive module.

In one proposed arrangement for locally extracting heat from an individual electrical component of a circuit board installation of th kind described, there is thermally interposed between the component and a thermal conductor for conducting extracted heat to the environment externally of the enclosure of the installation, a thermally conductive module comprising a tubular housing made of a metal, metal alloy or other material of high thermal conductivity and closed at one end, and a spring loaded piston made of a metal or metal alloy of high thermal conductivity slidably mounted in and protruding from the tubular housing. The closed end of the tubular housing of the module is arranged in thermal contact with the thermal conductor and the exposed end face of the piston is urged by its associated spring into thermal contact with the individual component from which heat is to be extracted so that heat emitted by the component flows via the piston and tubular housing into the thermal conductor from where it is conveyed to the surrounding environment.

It is recognised that, unless the abutting surfaces of the component and the exposed end face of the piston are each substantially flat—and in many instances the component does not have a substantially flat surface—the efficiency of the heat transfer from the component to the spring loaded piston is unsatisfactory with the result that an undesirable proportion of heat emitted by the component is not extracted by the thermally conductive module.

SUMMARY OF THE INVENTION

It is an object of the present invention to provide, for use in a circuit board installation of the kind described, an improved thermally conductive module for locally extracting heat from an individual electrical component of the installation.

According to the invention the improved thermally conductive module comprises a tubular housing which is made of metal, metal alloy or other material of high thermal conductivity and which is closed at one end; means at said closed end of the tubular housing for securing the housing to and in thermal contact with a thermal conductor; a spring-loaded piston of metal, metal alloy or other material of high thermal conductivity slidably mounted in and protruding from the tubular housing, which piston has at least one throughbore extending through and opening into the exposed end face of the piston; and, contained in the closed bore of the tubular housing, a grease-like medium of high thermal conductivity, the arrangement being such that, when the tubular housing is secured to and in thermal contact with a thermal conductor and the exposed end face of the piston is brought into thermal contact with an electrical component from which heat is to be extracted, the piston is urged against the action of its associated spring means and said grease-like medium will exude from said throughbore or throughbores opening into the exposed end face of the piston and will flow between said exposed end face and the electrical component to provide an effective thermal contact between said electrical component and the exposed end face of the piston.

The piston may have a single throughbore which is centrally located with respect to the exposed end face of the piston or it may have a plurality of throughbores circumferentially spaced around the central longitudinal axis of the piston. The exposed end face of the piston preferably is substantially flat and, preferably also, lies in a plane orthogonal to the longitudinal axis of the piston.

Preferably, the end part of the piston remote from said exposed end face has a recess into which the or each throughbore opens and which serves as a seating for a coil spring retained between the piston and the closed end wall of the tubular housing.

The exposed end face of the closed end of the tubular housing preferably is substantially flat and, preferably also, lies in a plane orthogonal to the longitudinal axis of the housing. The means for securing the tubular housing to and in thermal contact with a thermal conductor may take any convenient form but it preferably comprises an externally screw threaded stud which protrudes from the closed end of the tubular housing and which can either be screwed into a tapped hole in a thermal conductor or be passed through an aperture in a thermal conductor and secured thereto by means of a nut. Alternatively, the closed end of the tubular housing may have a tapped hole into which a screw, passing through an aperture in a thermal conductor, can be screwed to secure the thermally conductive module to and in thermal contact with the thermal conductor.

The grease-like medium of high thermal conductivity contained in the tubular housing may be any suitable grease having the desired thermally conductive properties. We prefer to employ for this purpose a silicone free, non-creep compound.

The tubular housing and piston may be made of any metal or metal alloy of high thermal conductivity. Preferred metals, metal alloys and other materials of which they may be made include aluminum-based alloys, copper-based alloys and non-electrically conductive metal oxides.

The improved thermally conductive module has the important advantage that, in addition to providing a good thermal contact between an electrical component from which heat is to be extracted and the exposed face of the piston, the grease-like medium of high thermal conductivity also improves the thermal contact between the piston and the tubular housing in which the piston is slidably mounted and thus provides an improved thermally conductive path from the electrical component to a thermal conductor to which the module is secured.

The improved thermally conductive module is simple and inexpensive and can be readily secured to a thermal conductor of a circuit board installation of the kind described for the extraction of heat from any desired individual electrical component of the installation.

The invention also includes, in a circuit board installation of the kind described, at least one improved thermally conductive module as hereinbefore described which is thermally interposed between an electrical component of the installation and a thermal conductor.

The invention is further illustrated by a description, by way of example, of a preferred thermally conductive module for locally extracting heat from an individual electrical component of a circuit board installation of the kind described, with reference to the accompanying drawings, in which:

DESCRIPTION OF PREFERRED EMBODIMENTS

Figure 1:
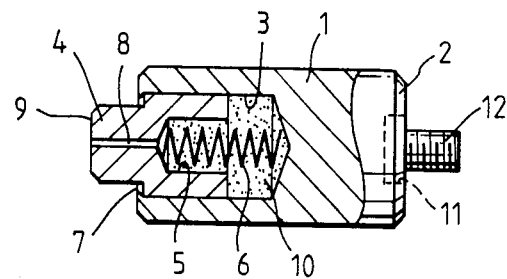
FIG. 1 is a sectional side view of the preferred thermally conductive module.

Referring to FIG. 1, the preferred thermally conductive module comprises a tubular housing 1 which is made of a metal alloy of high thermal conductivity and which is closed at one end 2. Slidably mounted in and protruding from the bore 3 of the tubular housing 1 is a piston 4 of metal alloy of high thermal conductivity which is urged towards the open end of the tubular body by a coil spring 6 retained between the closed end wall 2 of the tubular housing and the end wall of a recess 5 in the neighboring end part of the piston. The piston 4 is retained in the bore 3 of the tubular housing 1 by a peripherally continuous lip 7 at the open end of the housing. Extending through the piston 4 and opening into the exposed end face 9 of the piston is a single throughbore 8 which is centrally located with respect to the exposed end face. The exposed end face 9 of the piston 4 is substantially flat and lies in a plane orthogonal to the longitudinal axis of the piston. A grease-like medium 10 of high thermal conductivity is contained in the bore 3 of the tubular housing 1. The exposed end face of the closed end 2 of the tubular housing 1 is substantially flat and lies in a plane orthogonal to the longitudinal axis of the housing and the closed end of the housing has a tapped hole 11 into which is screwed an externally screw-threaded stud 12 which protrudes from the closed end of the housing.

Figure 2:
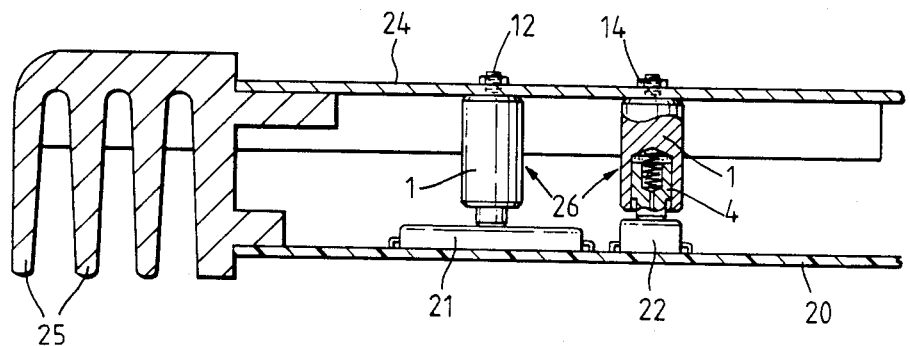
FIG. 2 is a fragmental side view of a circuit board installation of the kind described showing how two thermally conductive modules as shown in FIG. 1 are employed to extract heat from two electrical components of the installation.
Figure 3:
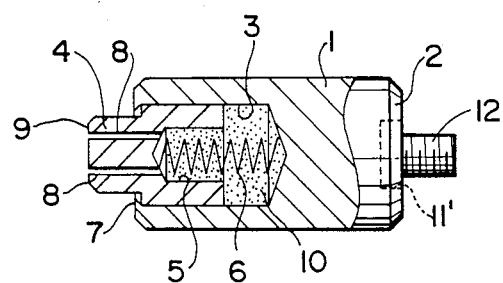
FIG. 3 shows a module having a plurality of throughbores and a tapped hole to receive a screw.

In the fragmental side view of a circuit board installation of the kind described as shown in FIG. 2, a printed circuit board 20 has two individual electrical components 21 and 22 mounted on and electrically connected to the printed circuit of the board and, associated with the printed circuit board, is a thermal conductor 24 which is in thermal contact with mutually spaced fins 25 for transferring heat from the conductor to the surrounding air. Associated with each individual electrical component 21 and 22 is a thermally conductive module 26 as described in FIG. 1. The tubular housing 1 of each thermally conductive module 26 is secured to and in thermal contact with the thermal conductor 24 by means of the screw-threaded stud 12 which passes through a hole in the thermal conductor and is secured thereto by a nut 14. The exposed end face 9 of the piston 4 of each thermally conductive module 26 is in thermal contact with its associated electrical component 21, 22 from which heat is to be extracted. The piston 4 is urged against the action of its associated coil spring 6 and grease-like medium 10 exudes from the throughbore 8 opening into the exposed end face 9 and flows between the exposed end face and the electrical component 21, 22 to provide an effective thermal contact between the electrical component and the exposed end face of the piston. Since the grease-like medium of high thermal conductivity substantially fills any spaces between the abutting surfaces of the electrical component 21, 22 and the exposed end face 9 of the piston 4, there is a high efficiency of heat transfer from the component to the spring-loaded piston and hence via the tubular housing 1 to the thermal conductor 24. FIG. 3 shows a piston 4 with a plurality of circumferentially spaced throughbores 8'. The tubular housing has a tapped hole 11' for receiving a screw.

What I claim as my invention is:

1. A thermally conductive module for locally extracting heat from an individual electrical component of a circuit board installation, which module comprises a tubular housing which is made of a material of high thermal conductivity and which is closed at one end; means at said closed end of the tubular housing for securing the housing to and in thermal contact with a thermal conductor; a spring-loaded piston of a material of high thermal conductivity slidably mounted in and protruding from the tubular housing, which piston has at least one throughbore extending through and opening into the exposed end face of the piston; spring means urging said piston in a direction away from said closed end of the tubular housing; and, contained in the bore of the tubular housing between said piston and said closed end of the tubular housing, a grease-like medium of high thermal conductivity, the arrangement being such that, when the tubular housing is secured to and in thermal contact with a thermal conductor and the exposed end face of the piston is brought into thermal contact with an electrical component from which heat is to be extracted, the piston is urged against the action of said spring means and said grease-like medium will exude from said at least one throughbore opening into the exposed end face of the piston and will flow between said exposed end face and the electrical component to provide an effective thermal contact between said electrical component and the exposed end face of the piston.

2. A thermally conductive module as claimed in claim 1, wherein the piston has a single throughbore which is centrally located with respect to the exposed end face of the piston.

3. A thermally conductive module as claimed in claim 1, wherein the piston has a plurality of throughbores circumferentially spaced around the central longitudinal axis of the piston.

4. A thermally conductive module as claimed in claim 1, wherein the exposed end face of the piston is substantially flat.

5. A thermally conductive module as claimed in claim 4, wherein the substantially flat exposed end face of the piston lies in a plane orthogonal to the longitudinal axis of the piston.

6. A thermally conductive module as claimed in claim 1, wherein the end part of the piston remote from said exposed end face has a recess into which the or each throughbore opens and which serves as a seating for a coil spring constituting said spring means and retained between the piston and the closed end of the tubular housing.

7. A thermally conductive module as claimed in claim 1, wherein the exposed end face of the closed end of the tubular housing is substantially flat.

8. A thermally conductive module as claimed in claim 7, wherein the substantially flat exposed end face of the closed end of the tubular housing lies in a plane orthogonal to the longitudinal axis of the housing.

9. A thermally conductive module as claimed in claim 1, wherein the means for securing the tubular housing to and in thermal contact with a thermal conductor comprises an externally screw-threaded stud which protrudes from the closed end of the tubular housing.

10. A thermally conductive module as claimed in claim 1, wherein the means for securing the tubualr housing to and in thermal contact with a thermal conductor comprises a tapped hole in the closed end of the tubular housing into which a screw, passing through an aperture in a thermal conductor, can be screwed.

11. A thermally conductive module as claimed in claim 1, wherein the grease-like medium of high thermal conductivity contained in the tubular housing is a silicone free, non-creep compound.

12. In a circuit board installation, at least one thermally conductive module as claimed in claim 1 which is thermally interposed between an electrical component of the installation and a thermal conductor.

* * * * *